(12) United States Patent
Tu et al.

(10) Patent No.: US 10,424,661 B1
(45) Date of Patent: Sep. 24, 2019

(54) AVALANCHE ROBUST LDMOS

(71) Applicant: Silanna Asia Pte Ltd, Singapore (SG)

(72) Inventors: Shanghui Larry Tu, San Diego, CA (US); Vadim Kushner, Solana Beach, CA (US); Eric Vann, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 15/945,588

(22) Filed: Apr. 4, 2018

(51) Int. Cl.
*H01L 29/10* (2006.01)
*H01L 29/66* (2006.01)
(Continued)

(52) U.S. Cl.
CPC ...... *H01L 29/7821* (2013.01); *H01L 27/0255* (2013.01); *H01L 28/20* (2013.01); *H01L 29/0649* (2013.01); *H01L 29/0696* (2013.01); *H01L 29/086* (2013.01); *H01L 29/0865* (2013.01); *H01L 29/0878* (2013.01); *H01L 29/0882* (2013.01); *H01L 29/1095* (2013.01); *H01L 29/402* (2013.01); *H01L 29/66113* (2013.01); *H01L 29/66681* (2013.01)

(58) Field of Classification Search
CPC ............... H01L 27/0248; H01L 29/742; H01L 29/7412; H01L 29/7408; H01L 29/78; H01L 29/42384; H01L 29/78615; H01L 29/41733; H01L 29/78654
See application file for complete search history.

(56) References Cited

U.S. PATENT DOCUMENTS 6,140,678 A 10/2000 Grabowski et al.
2003/0001209 A1 1/2003 John et al.
(Continued)

FOREIGN PATENT DOCUMENTS

JP 2010278188 A 12/2010
KR 1020140042466 A 4/2014
KR 1020160147222 A 12/2016

OTHER PUBLICATIONS

Pendharkar et al, "ESD robust integrated output device for smart power ICs," Proceedings of the 17th International Symposium on Power Semiconductor Devices & IC's, May 23-26, 2005, Santa Barbara, CA, 4 pages.
(Continued)

*Primary Examiner* — Roy K Potter
(74) *Attorney, Agent, or Firm* — MLO, a professional corp.

(57) ABSTRACT

A semiconductor device includes an active region formed over a substrate. The active region includes a FET and a diode. The FET includes one or more FET fingers. Each FET finger includes a FET source region, a FET drain region, and a lateral FET gate electrode. The diode includes one or more diode fingers. Each of the diode fingers includes a diode anode region electrically coupled to the FET source region, a diode cathode region electrically coupled to the FET drain region, and a lateral diode gate electrode electrically coupled to the diode anode region and electrically isolated from the lateral FET gate electrode. The FET fingers are active fingers of the semiconductor device and the diode fingers are dummy fingers of the semiconductor device. The diode is configured to clamp a maximum voltage developed across the FET drain region and the FET source region.

21 Claims, 10 Drawing Sheets

(51) Int. Cl.
  *H01L 29/78*   (2006.01)
  *H01L 29/06*   (2006.01)
  *H01L 29/08*   (2006.01)
  *H01L 27/02*   (2006.01)
  *H01L 49/02*   (2006.01)
  *H01L 29/40*   (2006.01)

(56) References Cited

U.S. PATENT DOCUMENTS

| | | |
|---|---|---|
| 2007/0228475 A1 | 10/2007 | Burdeaux et al. |
| 2008/0067588 A1 | 3/2008 | Williams et al. |
| 2013/0009253 A1 | 1/2013 | Wang et al. |
| 2014/0034999 A1* | 2/2014 | Korec ............... H01L 29/7393 257/140 |

OTHER PUBLICATIONS

International Search Report dated Aug. 1, 2019 for PCT Patent Application No. PCT/IB2019/052355.

* cited by examiner

AVALANCHE ROBUST LDMOS

BACKGROUND

Metal-oxide field effect transistors (MOSFETs) generally include a gate electrode, a source region, a drain region, and a body region. The source region and the drain region are of a first conductivity type, and the body region is of a second conductivity type. In some MOSFET devices, the first conductivity type is n-type and the second conductivity type is p-type. In other MOSFET devices, this relationship is reversed. When a MOSFET device is in an on state in response to an applied gate voltage, a channel region forms in the body region below the gate, and between the drain region and the source region. Current flows in the channel region. When the MOSFET device is in an off state, the channel region is not present, and thus current will not flow between the drain region and the source region. However, if a reverse-bias voltage is applied across the drain region and the source region of the MOSFET that exceeds a breakdown voltage, a large uncontrolled current will flow between the source region and the drain region regardless of whether a voltage is applied to the gate electrode. As the reverse-bias voltage increases above the breakdown voltage, an avalanche breakdown event can occur. During the avalanche breakdown event, current through the MOSFET increases at an increasing rate and can quickly exceed a maximum current rating of the MOSFET. As a result, the MOSFET is often damaged or entirely destroyed.

Lateral diffusion MOSFETs (LDMOS) are a class of MOSFETs that additionally include a lateral lightly doped drain (LDD) region to increase breakdown voltage of the semiconductor device as compared to the breakdown voltage of a typical MOSFET. The LDD region is of the same conductivity type as the body region but is doped to a different concentration. Though the LDMOS may have an increased breakdown voltage as compared to a MOSFET, avalanche breakdown events can still occur if a reverse-bias voltage exceeds the breakdown voltage of the LDMOS.

SUMMARY

In some embodiments, a semiconductor device includes a substrate and an active region. The active region includes a FET and a diode formed over the substrate. The FET includes one or more FET fingers formed in the active region, each FET finger having a FET source region, a FET drain region, and a lateral FET gate electrode. The diode includes one or more diode fingers formed in the active region, each diode finger having a diode anode region electrically coupled to the FET source region, a diode cathode region electrically coupled to the FET drain region, and a lateral diode gate electrode electrically coupled to the diode anode region and electrically isolated from the lateral FET gate electrode. The one or more FET fingers of the FET are active fingers of the semiconductor device and the one or more diode fingers of the diode are dummy fingers of the semiconductor device. The diode is configured to clamp a maximum voltage developed across the FET drain region and the FET source region.

In some embodiments, a semiconductor device includes a substrate and an active region formed over the substrate. The active region includes one or more active fingers and one or more diode fingers. Each active finger includes an active lateral gate electrode, two or more first active doped regions of a first conductivity type, and one or more second active doped regions doped of a second conductivity type. Each diode finger includes a diode lateral gate electrode, one or more first diode doped regions of the first conductivity type, and one or more second diode doped regions of the second conductivity type. Each active finger includes more regions doped to the first conductivity type than does the diode finger. The active finger includes the same number of regions doped to the second conductivity type as does the diode finger. The active lateral gate electrode is electrically isolated from the diode lateral gate electrode. The diode lateral gate electrode is electrically coupled to a diode region of the second diode doped regions. The one or more diode fingers are dummy fingers of the semiconductor device. The one or more diode fingers are configured to clamp a maximum voltage developed across two of the first active doped regions.

In some embodiments, a method for forming a semiconductor involves providing a substrate and forming an active region over the substrate. The active region includes one or more active fingers and one or more diode fingers. A FET is formed within one or more of the active fingers. The FET includes a FET source region, a FET drain region, and a lateral FET gate electrode. A diode is formed within one or more of the diode fingers. The diode includes a diode anode region, a diode cathode region, and a lateral diode gate electrode. The FET source region is electrically coupled to the diode anode region. The FET drain region is electrically coupled to the diode cathode region. The lateral diode gate electrode is laterally coupled to the diode anode region. The one or more diode fingers are dummy fingers of the semiconductor device. The lateral FET gate electrode is electrically isolated from the lateral diode gate electrode. The diode is configured to clamp a maximum voltage developed across the FET drain region and the FET source region.

DETAILED DESCRIPTION

Figure 1:
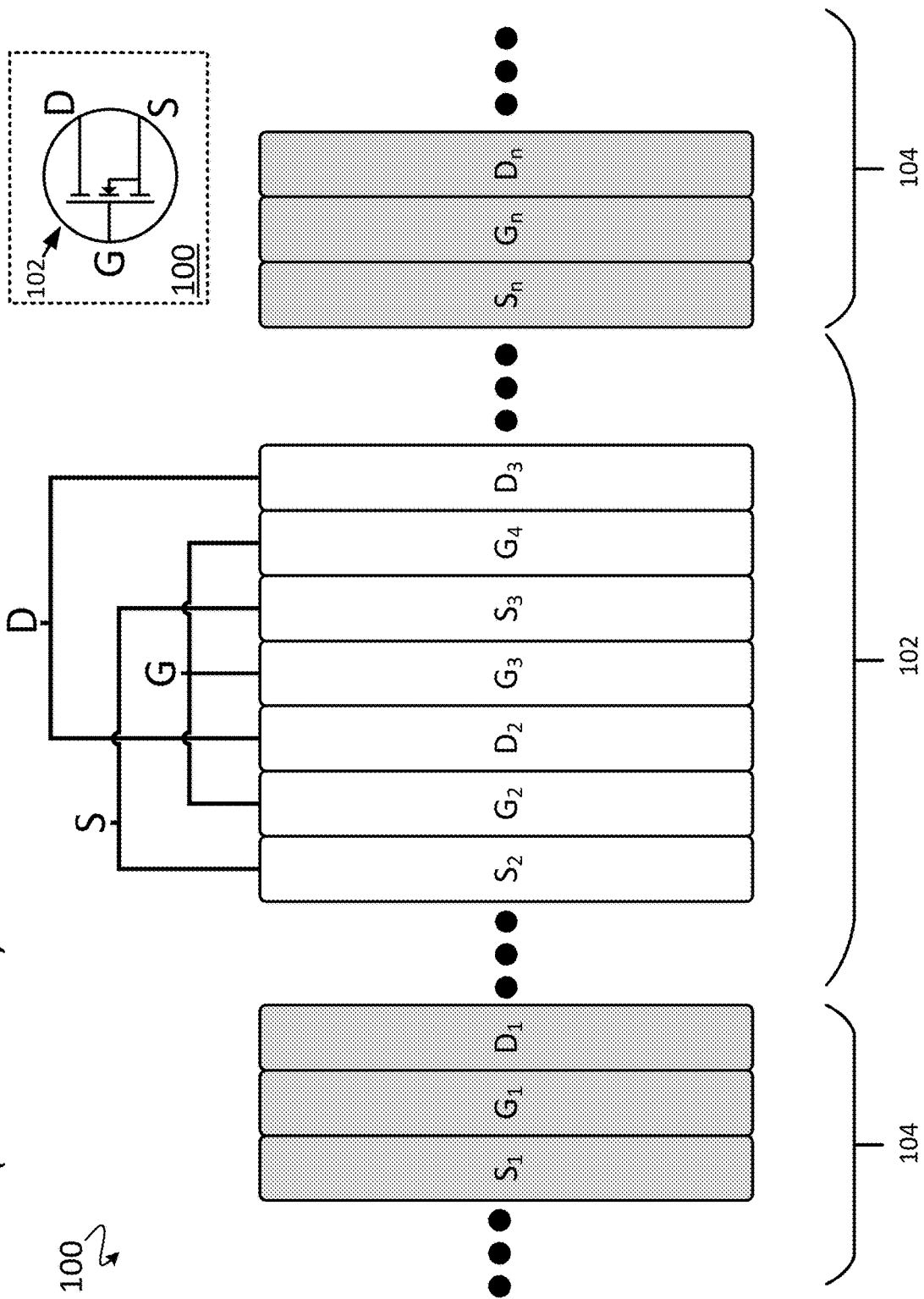
FIG. 1 is a simplified orthoscopic diagram of a portion of a prior art multi-finger semiconductor device.

Avalanche breakdown can occur in an LDMOS device when a reverse-bias voltage developed across a source region and drain region of the LDMOS exceeds a breakdown voltage level of the LDMOS device. When avalanche breakdown occurs, the LDMOS can be damaged or destroyed. One way to mitigate the risk of an avalanche breakdown event is to implement a reverse-biased diode in parallel with the LDMOS device. In such embodiments, a cathode region of the diode is electrically coupled to the drain region of the LDMOS device, and an anode region of the diode is electrically coupled to the source region of the LDMOS device. The diode is configured to have a target (e.g., desired) diode breakdown voltage level that is less than a breakdown voltage that would cause an avalanche breakdown event to occur in the LDMOS device. When a reverse-bias voltage exceeds the diode's breakdown voltage, the diode conducts a large amount of current. This current flow reduces or eliminates the reverse-bias voltage across the LDMOS device. Because the reverse-bias voltage across the LDMOS is reduced or eliminated the LDMOS is prevented from experiencing an avalanche breakdown event.

In example embodiments and methods described herein, one or more diodes are advantageously monolithically integrated with one or more LDMOS devices on a common substrate of a semiconductor device. The semiconductor device includes one or more active fingers and one or more dummy fingers (which are sometimes also referred to as termination fingers). In some embodiments, the dummy fingers are fingers of a multi-finger semiconductor device that are adjacent to a terminating perimeter (e.g., an outside perimeter) of the semiconductor device. In some embodiments, there are multiple fingers adjacent to the terminating perimeter of the semiconductor device that are configured to be dummy fingers. In some embodiments a dummy finger is a finger of a multi-finger semiconductor device having a control node (e.g., a gate electrode) that is not electrically coupled to corresponding control nodes (e.g., gate electrodes) of active fingers of the semiconductor device. In some embodiments, the LDMOS devices are formed within one or more of the active fingers and diodes are formed in one or more of the dummy fingers. These diodes are electrically coupled to be in parallel with the LDMOS devices formed in one or more active fingers of the semiconductor device. The diode or diodes formed in the dummy fingers are configured to have a breakdown voltage level that is below a reverse-bias voltage level that would trigger an avalanche event in the LDMOS formed in the active fingers. Thus, the area of the semiconductor that would typically be wasted by the dummy fingers is advantageously repurposed as one or more diodes to extend and protect the life of the LDMOS formed in the active fingers. Additionally, because the dummy fingers are similar to the active fingers, a process flow to create the semiconductor device is advantageously simplified as compared to a process flow to monolithically integrate dissimilar semiconductor devices.

FIG. 1 shows a simplified prior art orthoscopic diagram of a multi-finger semiconductor device 100. The semiconductor device 100 generally includes two or more active fingers 102 and two or more dummy fingers 104. An LDMOS device is formed in the active fingers 102, as shown by alternating source regions $S_{2-3}$, gate electrodes $G_{2-4}$, and drain regions $D_{2-3}$. A metallization layer (not shown) may be used to electrically couple corresponding regions of the active fingers 102 together as shown schematically. For example, a metallization layer may electrically couple each of the gate electrodes $G_{2-4}$ of the active fingers 102 together; another metallization layer may electrically couple each of the source regions $S_{2-3}$ of the active fingers 102 together, and so on. The dummy fingers 104 are typically positioned near an outside perimeter of the semiconductor device 100 to minimize peripheral effects of a process flow used to form the semiconductor device 100. The dummy fingers 104 include alternating source $S_{1-n}$ regions, gate electrodes $G_{1-n}$, and drain regions $D_{1-n}$ that are similar to corresponding regions of the active fingers 102, with some exceptions. For example, regions of the dummy fingers 104 may not be electrically coupled to corresponding regions within the active fingers 102 (e.g., $G_1$ is typically electrically isolated from $G_2$).

Figure 2:
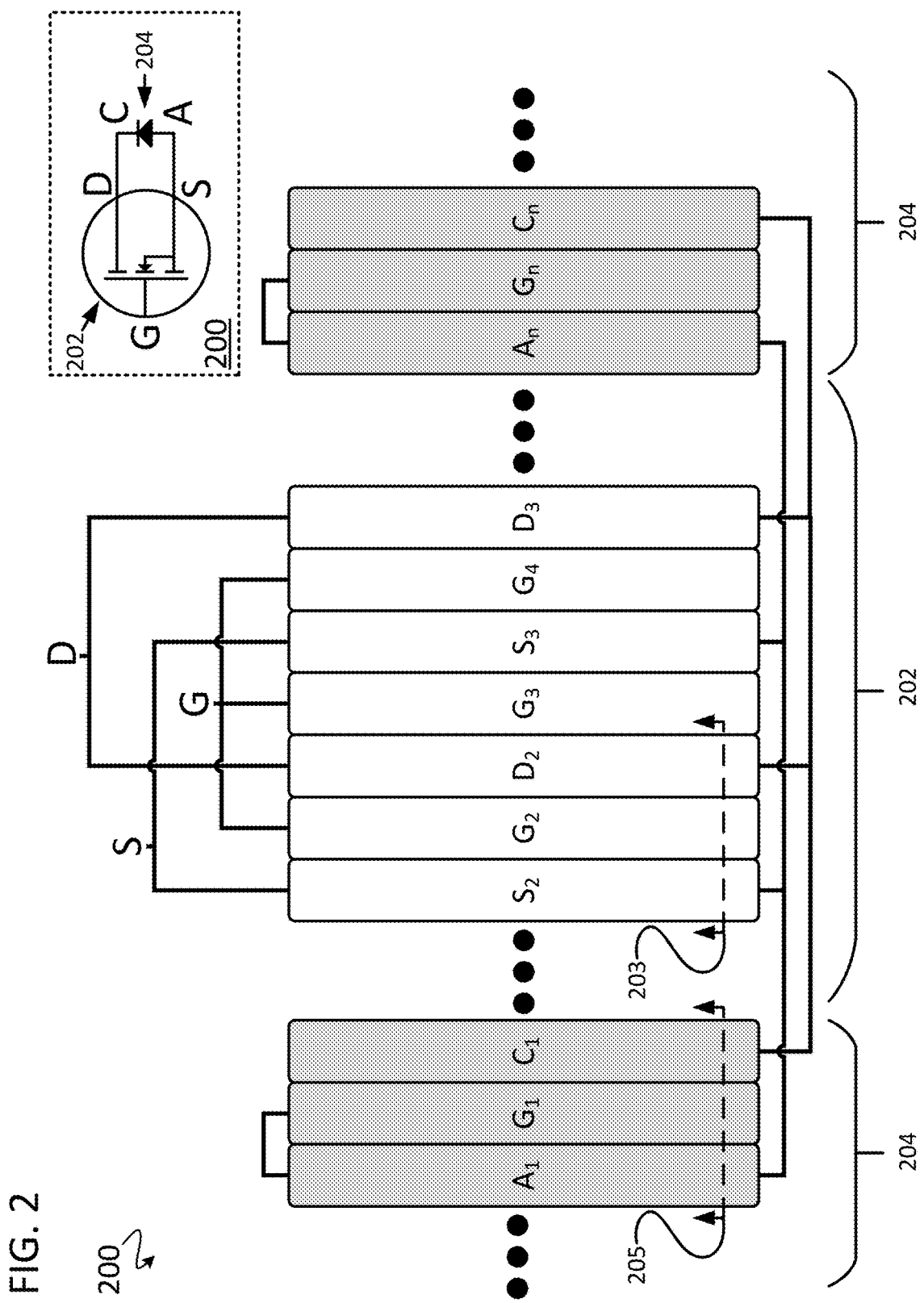
FIG. 2 is a simplified orthoscopic diagram of a portion of a multi-finger semiconductor device, in accordance with some embodiments.

FIG. 2 shows a simplified orthoscopic diagram of a multi-finger semiconductor device 200, in accordance with some embodiments. Some portions of the semiconductor device 200 understood by one of skill in the art to be present have been omitted from FIG. 2 for simplicity. The semiconductor device 200 generally includes two or more active fingers 202 and two or more dummy fingers 204. The dummy fingers 204 are typically positioned near an outside perimeter of the semiconductor device 200, though in some embodiments the dummy fingers 204 are interleaved between the active fingers 202. A cross-section cutting line 203 through a portion of the active fingers 202 corresponds to a portion of an LDMOS shown and discussed with reference to FIG. 3. A cross-section cutting line 205 through a portion of the dummy fingers 204 corresponds to a diode shown and discussed with reference to FIGS. 4-6.

An LDMOS device is formed in the active fingers 202, as shown by alternating source regions $S_{2-3}$, gate electrodes $G_{2-4}$, and drain regions $D_{2-3}$. As described with reference to FIG. 1, metallization layers (not shown) may be used to electrically couple corresponding regions of the active fingers 202 together as shown schematically. Additionally, other metallization layers (not shown) may be used to electrically couple regions of the dummy fingers 204 to each other and to regions of the active fingers 202 as shown schematically. For simplicity, only three LDMOS devices are shown in the active fingers 202 (e.g., as controlled by gate electrodes $G_2$, $G_3$, and $G_4$). However, in some embodiments the active fingers 202 include significantly more LDMOS devices. In the example, the active fingers 202 constitute a single LDMOS device. In other embodiments, two or more independent LDMOS devices are formed in the active fingers 202. For example, in such embodiments a first LDMOS device and a second LDMOS device are implemented by a set of multiple interleaved fingers and are interconnected by a set of alternating electrically conducting paths.

One or more regions of the dummy fingers 204 are modified to form gated diode(s). The diodes have alternating anode regions $A_{1-n}$, dummy gate electrodes $G_{1-n}$, and cathode regions $C_{1-n}$. Dummy gate electrodes $G_{1-n}$ of each diode are electrically coupled to a respective anode region $A_{1-n}$ of that diode to prevent a current conduction channel from forming in a body region of the diode. The dummy gate electrode is called a "dummy" gate electrode because it is not configured to receive a gate voltage. Diodes formed in the dummy fingers 204 are electrically coupled in parallel to the LDMOS formed in the active fingers 202. As shown, the anode regions $A_{1-n}$ formed in the dummy fingers 204 are electrically coupled to the source regions $S_{2-3}$ of the LDMOS formed in the active fingers 202. Likewise, the cathode regions $C_{1-n}$ formed in the dummy fingers 204 are electrically coupled to the drain regions $D_{2-3}$ of the LDMOS formed in the active fingers 202. A ratio of diodes to LDMOS devices is chosen based on desired performance, among other factors. In some embodiments, there are ten LDMOS devices for every one diode (a ratio of 10-1). In some embodiments, this ratio is 1-to-1, 1-2, 2-1, 2-2, 5-1, and so on. In some embodiments, this ratio is 20-1, 50-1, 100-1, and so on. In some embodiments, the semiconductor device 200 is designed to have the smallest number of dummy fingers 204 possible while still meeting other design, process and/or performance criteria.

As shown, surface area of the semiconductor device 200 that would typically be wasted by the dummy fingers 204 is advantageously repurposed as one or more diodes to extend and protect the life of the LDMOS formed in the active fingers 202. That is, the diode or diodes formed in the dummy fingers 204 are configured to have a target breakdown voltage level that is below a reverse-bias voltage level that would trigger an avalanche event in the LDMOS formed in the active fingers 202. Thus, diodes formed in the dummy fingers 204 advantageously reduce or eliminate the chances of an avalanche event occurring within the LDMOS formed in the active fingers 202. Additionally, because the dummy fingers 204 are similar to the active fingers 202, a process flow to create the semiconductor device 200 is advantageously simplified as compared to a process flow to monolithically integrate dissimilar semiconductor devices, e.g., an LDMOS device and a separately formed reverse-biased diode in parallel with the LDMOS device.

Figure 3:
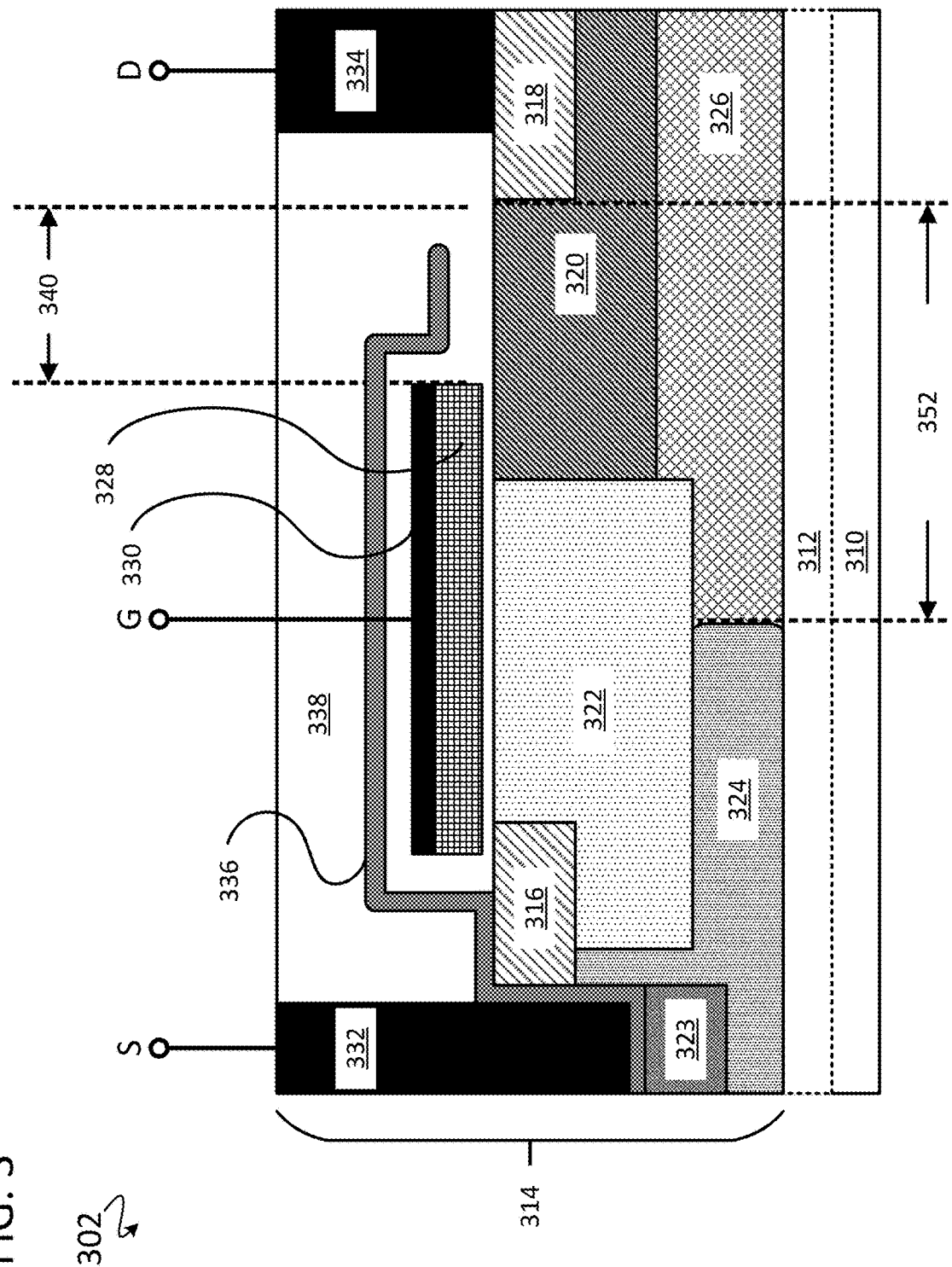
FIG. 3 is a simplified cross-section diagram of an example LDMOS structure in an active finger of a multi-finger semiconductor device, in accordance with some embodiments.

FIG. 3 is a simplified cross-section diagram, taken through the cutting line 203 of FIG. 2, of an example LDMOS device 302 formed in the active fingers 202, in accordance with some embodiments. The LDMOS 302 generally includes a substrate 310, an optional buried insulator layer 312 (as indicated by dashed lines), and an active region 314 formed over the substrate 310 or over the buried insulator layer 312. The active region 314 can be any of a doped portion of the bulk of a semiconductor wafer, a localized well formed in a larger doped portion of a semiconductor wager, an active layer of a semiconductor-on-insulator (SOI) wafer, and a localized well formed in an SOI wafer. In the example shown, the active region 314 is a thin film formed over the substrate 310 or over the buried insulator layer 312. Some portions of the LDMOS 302 understood by one of skill in the art to be present have been omitted from FIG. 3 for simplicity. For example, one or more metallization layers and interconnects are not shown, though are understood to be present. The active region 314 generally includes doped semiconductor regions of a first conductivity type and regions of a second conductivity type, formed by, example, by implanting impurities into the active region 314. For example, the regions of the first conductivity type can be formed by implanting one kind of dopant atom, and the regions of the second conductivity type can be formed by implanting another kind of dopant atom. In some embodiments the first conductivity type is n-type and the second conductivity type is p-type. In other embodiments, the first conductivity type is p-type and the second conductivity type is n-type. The regions of the first conductivity type include a source region 316, a drain region 318, an LDD region 320, and a buried region 326. The regions of the second conductivity type include a body region 322, a source contact region 323, and a buried well 324. A silicide layer 330 on a lateral polysilicon gate electrode 328 forms a gate bus which is electrically coupled to a gate terminal (G) located in a third dimension. Lateral is defined herein as being within a plane that is parallel to a top surface plane of the substrate 310. A shielding structure 336 is formed as a lateral extension of a conductive layer lining a source trench, shown on the left side of the LDMOS 302, which is filled with top metal to form a source contact electrode 332. The source contact electrode 332 is electrically coupled to a source terminal (S) located in a third dimension. Top metal also forms a drain contact electrode 334 which is electrically coupled to a drain terminal (D) located in a third dimension. A dielectric 338 electrically insulates portions of the active region 314. A lateral distance 340 between an edge of the gate electrode 328 and the nearest edge of the drain region 318 is shown for reference with respect to FIGS. 4-5. A lateral distance 352 between an edge of the buried well 324 and the nearest edge of the drain region 318 is shown for reference with respect to FIGS. 5-6.

When sufficient gate voltage is applied to the gate electrode 328, the LDMOS 302 is in an on state. In the on state, a conduction channel forms between the source region 316 and the drain region 318 and current flows in the conduction channel. Normally when no gate voltage is applied to the gate electrode 328, the conduction channel is not formed, and the LDMOS 302 is in an off state. However, if a reverse-bias voltage that exceeds a breakdown voltage of the LDMOS 302 is applied across the source region 316 and the drain region 318, an avalanche event can occur, whereby uncontrolled current flows between these regions regardless of whether a gate voltage is applied to the gate electrode 328.

Figure 4:
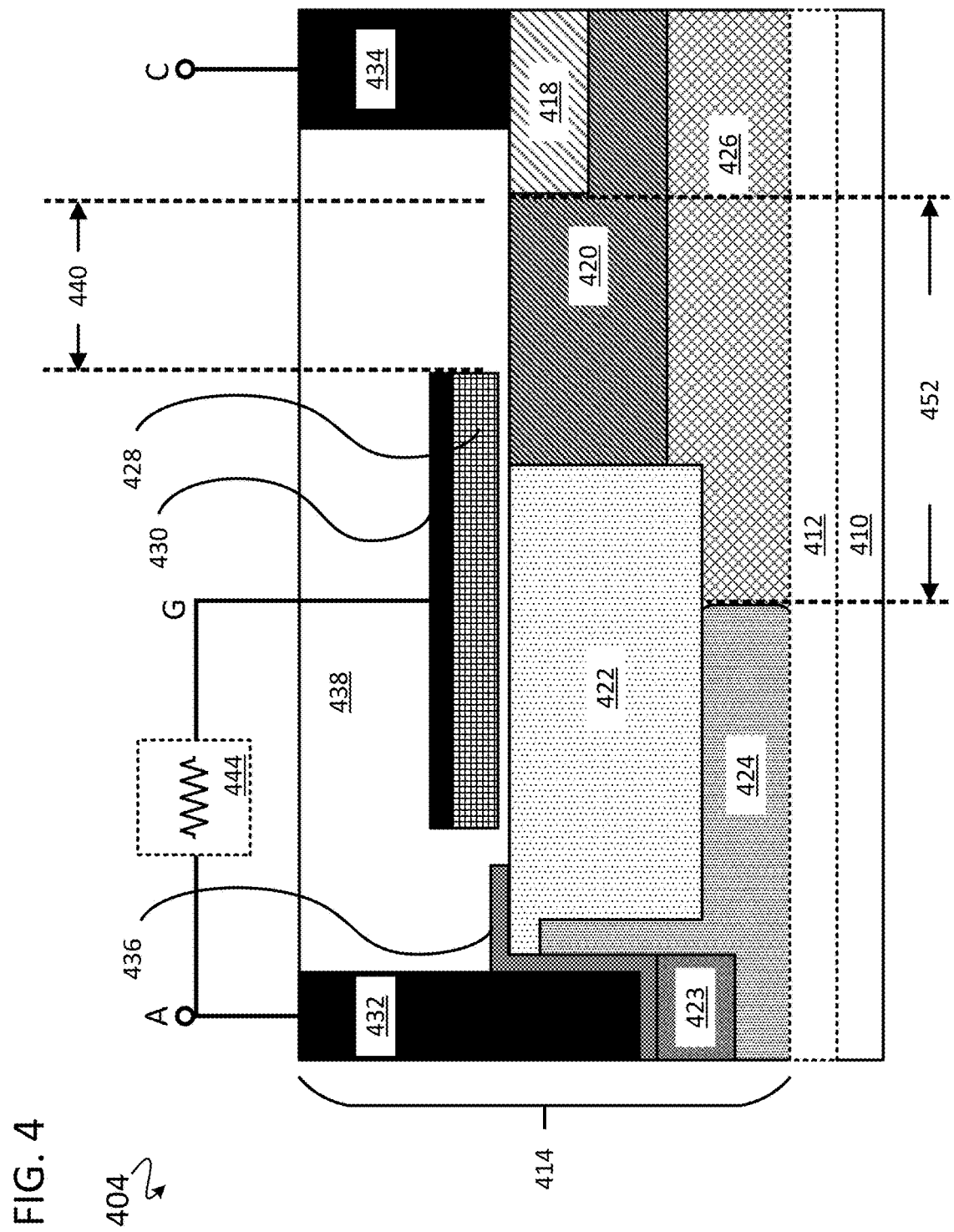
FIGS. 4-6 are simplified cross-section diagrams of example diode structures in a dummy finger of a multi-finger semiconductor device, in accordance with some embodiments.

FIG. 4 is a simplified cross-section diagram, taken through the cutting line 205 of FIG. 2, of an example diode 404 formed in the dummy fingers 204, in accordance with some embodiments. The diode 404 generally includes a substrate 410, an optional buried insulator layer 412, and an active region 414 formed over the substrate 410 or over the buried insulator layer 412. Some portions of the diode 404 understood by one of skill in the art to be present have been omitted from FIG. 4 for simplicity. For example, metallization layers and other interconnects understood to be present are omitted from FIG. 4. In some embodiments, the substrate 410 and the substrate 310 of FIG. 3 are portions of the same substrate. That is, in such embodiments, the LDMOS 302 and the diode 404 are formed monolithically on the same substrate. Similarly, in some embodiments, the optional buried insulator layer 412 and the optional buried insulator layer 312 of FIG. 3 are portions of the same buried insulator layer.

The active region 414 generally includes regions of the first conductivity type and regions of the second conductivity type in accordance with respective regions in the active region 314 described with reference to FIG. 3. In some embodiments, regions of the first conductivity type of the diode 404 have the same doping depth, concentration and lateral extent as corresponding regions of the LDMOS 302. Similarly, in some embodiments, regions of the second conductivity type of the diode 404 have the same doping depth, concentration and lateral extent as corresponding regions of the LDMOS 302. The regions of the first conductivity type include a cathode contact region 418, an LDD region 420, and a buried region 426. The regions of the second conductivity type include a body region 422, an anode contact region 423, and a buried well 424. A source region, similar to the source region 316 of the LDMOS 302, is omitted from the diode 404. Omitting a source region advantageously creates an anode region comprised of the body region 422, the buried well 424, and the anode contact region 423, each of these regions being of the second conductivity type. Top metal forms an anode contact electrode 432 which is electrically coupled to an anode terminal (A) located in a third dimension. Top metal also forms a cathode contact electrode 434 which is electrically coupled to a cathode terminal (C) located in a third dimension. The anode contact region 423 is electrically coupled to source contact region 323 of the LDMOS 302, and the cathode contact region 418 is electrically coupled to the drain region 318 of the LDMOS 302 (e.g., by top metal). A lateral gate electrode 428 with a silicide layer 430 is electrically coupled to the anode contact region 423. The gate electrode 428 is electrically isolated from the gate electrode 328 of the LDMOS 302. A dielectric 438 electrically insulates portions of the active region 414.

By changing lateral distances between doped regions of the diode 404, or by making other modifications that will be discussed, a target breakdown voltage (e.g., a desired breakdown voltage chosen at design time) of the diode 404 is configured to be less than a breakdown voltage of the LDMOS 302. For example, in the embodiment shown in FIG. 4, a lateral distance 440 between the gate electrode 428 and the nearest edge of the cathode contact region 418 is the same as the lateral distance 340 shown in FIG. 3. Likewise, a lateral distance 452 between the buried well 424 and the nearest edge of the cathode contact region 418 is the same as the lateral distance 352 shown in FIG. 3. However, given the same lateral distances 440 and 452, a target breakdown voltage of the diode 404 is reduced by forming the diode 404 such that a truncated shielding structure 436 does not overlap any portion of the gate electrode 428 (e.g., as compared to the lateral extent of the shielding structure 336 over the gate electrode 328 shown in FIG. 3). In some embodiments, no portion of the truncated shielding structure 436 is included as part of the diode 404 (e.g., the shielding structure 436 is not formed as part of a process flow to form the diode 404). Removing or omitting the shielding structure 436 will cause the breakdown voltage of the diode 404 to decrease due to lack of carrier depletion previously provided by the shielding structure.

In some embodiments, the gate electrode 428 is electrically shorted to the anode contact region 423 by a metal. Electrically shorting the gate electrode 428 to the anode contact region 423 advantageously prevents a conduction channel from forming in the diode 404, thereby reducing leakage current under high-frequency operation of the semiconductor device. In other embodiments, a resistor 444 couples the gate electrode 428 to the anode contact region 423. During an electrostatic discharge event, transient current through the resistor 444 will cause a voltage drop that inverts the region under the gate electrode 428 and forms a conduction channel. By coupling the gate electrode 428 to the anode contact region 423 through the resistor 444, a trigger voltage of the diode 404 is advantageously lowered as compared to embodiments of the diode 404 where the gate electrode 428 is electrically shorted to the anode contact region 423. Additionally, because a conduction channel is formed due to inversion, avalanche robustness of the diode 404 is advantageously increased.

The diode 404 is electrically coupled in parallel to the LDMOS 302 as previously described. As such, a reverse-bias voltage applied across the drain region 318 and the source region 316 of the LDMOS 302 will also be present across the cathode contact region 418 and the anode contact region 423 of the diode 404. If that reverse-bias voltage exceeds a breakdown voltage of the diode 404, current will flow from the cathode contact region 418 to the anode contact region 423. This flow of current will cause the reverse-bias voltage across the LDMOS 302 to be reduced or eliminated. Thus, an avalanche event is prevented from occurring within the LDMOS 302, thereby protecting the LDMOS 302 from potential damage.

Figure 5:
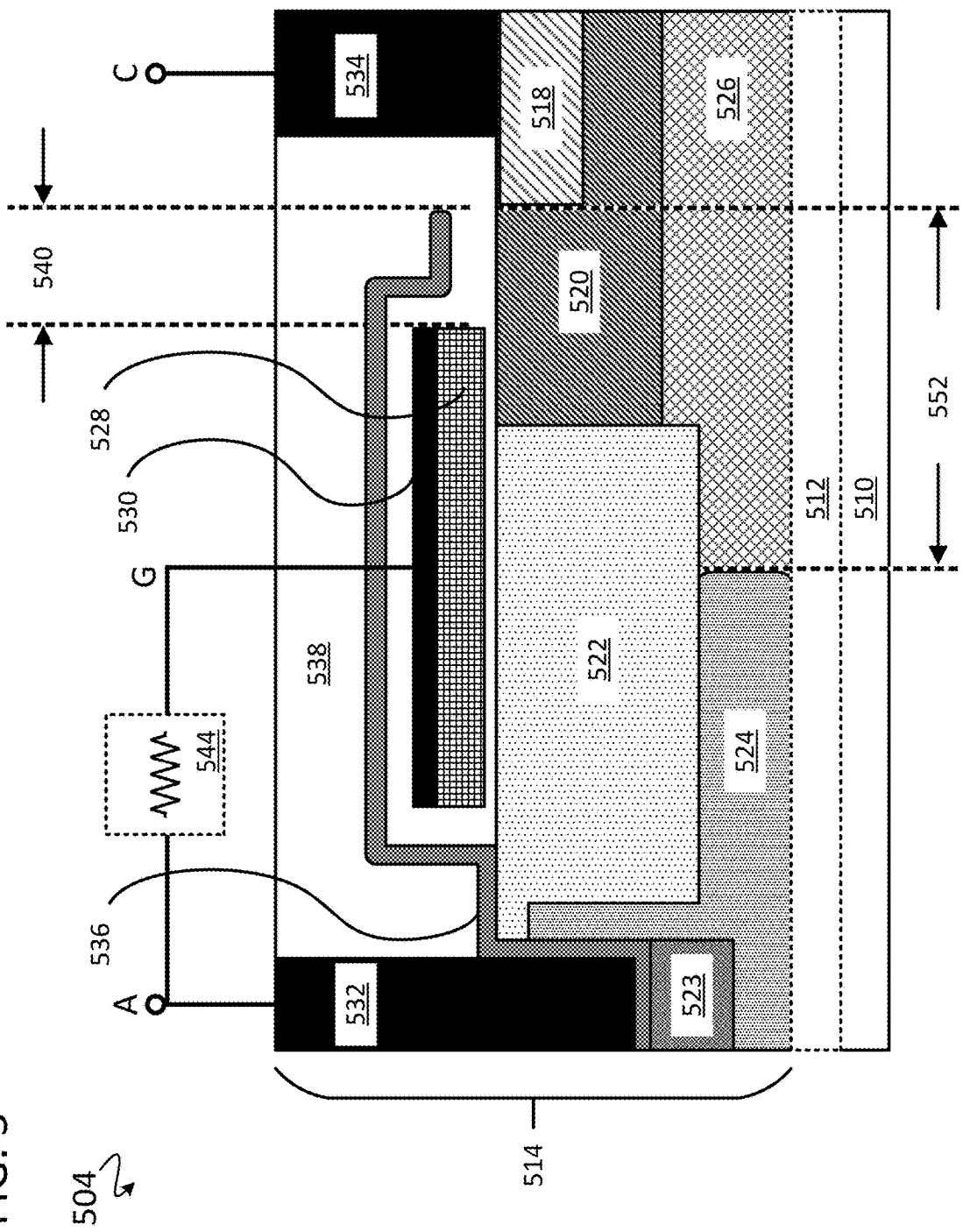

FIG. 5 is a simplified cross-section diagram, taken through the cutting line 205 of FIG. 2, of an example diode 504 formed in the dummy fingers 204, in accordance with some embodiments. In the embodiment shown, a target breakdown voltage of the diode 504 is modified as compared to the diode 404 by reducing a lateral distance 540 between a lateral gate electrode 528 and the nearest edge of a cathode contact region 518. Other regions of the diode 504 are the same or similar to like numbered regions and features of the diode 404. For example, a body region 522 is the same or similar to the body region 422, a buried well 524 is similar to the buried well 424, a substrate 510 is similar to the substrate 410, and so on. Likewise, embodiments of electrical couplings and electrical isolations of the diode 504 are the same or similar to embodiments of electrical couplings and electrical isolations of the diode 404. A lateral distance 552 between an edge of the buried well 524 and the nearest edge of the cathode contact region 518 is shown for reference with respect to FIG. 6.

The diode 504 generally includes a substrate 510, an optional buried insulator layer 512, and an active region 514 formed over the substrate 510 or over the buried insulator layer 512. Some portions of the diode 504 understood by one of skill in the art to be present have been omitted from FIG. 5 for simplicity. For example, metallization layers and other interconnects understood to be present are omitted from FIG. 5. The active region 514 generally includes regions of the first conductivity type and regions of the second conductivity type in accordance with respective regions in the active region 314. In some embodiments, regions of the first conductivity type of the diode 504 have the same doping depth and concentration as corresponding regions of the LDMOS 302, but the lateral extents differ. Similarly, in some embodiments, regions of the second conductivity type of the diode 504 have the same doping depth and concentration as corresponding regions of the LDMOS 302, but the lateral extents differ. The regions of the first conductivity type include a cathode contact region 518, an LDD region 520, and a buried region 526. The regions of the second conductivity type include a body region 522, an anode contact region 523, and a buried well 524. A source region, similar to the source region 316 of the LDMOS 302, is omitted from the diode 504. Omitting the source region creates an anode region within the diode 504. The anode region includes the anode contact region 523, the body region 522 and the buried well 524, each region being of the second conductivity type. Top metal forms an anode contact electrode 532 which is electrically coupled to an anode terminal (A) located in a third dimension. Top metal also forms a cathode contact electrode 534 which is electrically coupled to a cathode terminal (C) located in a third dimension. The anode contact region 523 is electrically coupled to the source contact region 323 of the LDMOS 302, and the cathode contact region 518 is electrically coupled to the drain region 318 of the LDMOS 302 (e.g., by top metal). A gate electrode 528 with a silicide layer 530 is electrically coupled to the anode contact region 523 either directly (e.g., by top metal), or through an optional resistor 544 which is the same or similar to the resistor 444. The gate electrode 528 is electrically isolated from the gate electrode 328 of the LDMOS 302. A dielectric 538 electrically insulates portions of the active region 514. A shielding structure 536 overlaps (e.g., extends laterally over) the gate electrode 528. With no other modifications, the lateral extension of the shielding structure 536 would raise a target breakdown voltage of the diode 504 as compared to the diode 404. However, in the embodiment shown, the lateral distance 540 is reduced as compared to both the lateral distance 440 of diode 404 and the lateral distance 340 of the LDMOS 302. This reduction in lateral distance reduces the target breakdown voltage of the diode 504 as compared to the diode 404. Additionally, the lateral distance 552 is reduced as compared to both the lateral distance 452 of the diode 404 and the lateral distance 352 of the LDMOS 302. This further reduces the breakdown voltage of the diode 504 as compared to the diode 404. The lateral distance 540 and the lateral distance 552 can be chosen at design time such that a target breakdown voltage of the diode 504 is lower than a breakdown voltage of the LDMOS 302.

Figure 6:
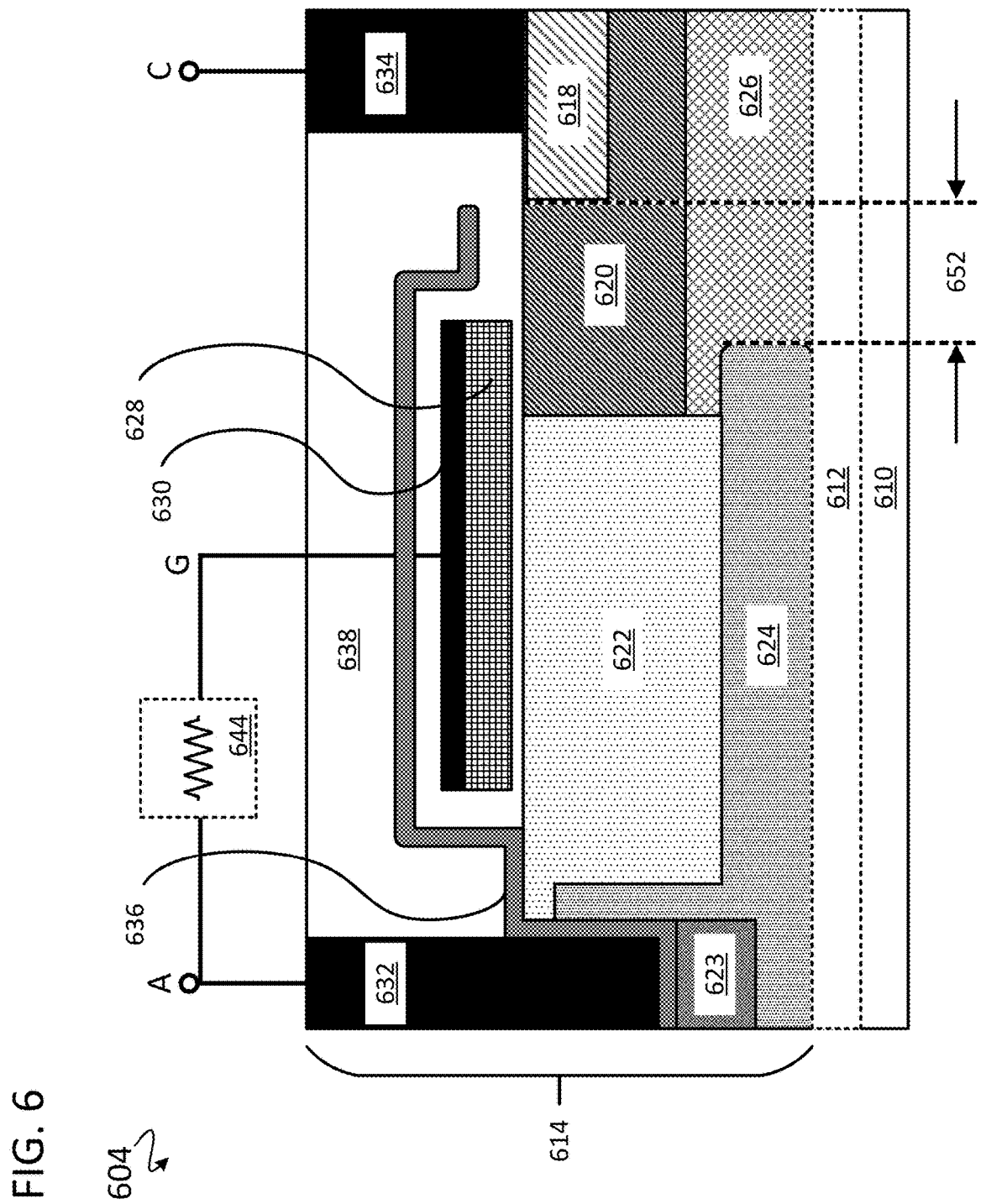

FIG. 6 is a simplified cross-section diagram, taken through the cutting line 205 of FIG. 2, of an example diode 604 formed in the dummy fingers 204, in accordance with some embodiments. In the embodiment shown, a breakdown voltage of the diode 604 is modified as compared to the diode 504 by reducing a lateral distance 652 between a buried well 624 and the nearest edge of a cathode contact region 618 as compared to the lateral distance 552 of the diode 504. Other regions of the diode 604 are the same or similar to like numbered regions and features of the diode 504. For example, a body region 622 is the same or similar to the body region 522, a buried well 624 is similar to the buried well 524 (except with regards to a modified lateral extent of the buried well 624), a substrate 610 is similar to the substrate 510, and so on. Likewise, embodiments of electrical couplings and electrical isolations of the diode 604 are the same or similar to embodiments of electrical couplings and electrical isolations of the diode 504.

The diode 604 generally includes a substrate 610, an optional buried insulator layer 612, and an active region 614 formed over the substrate 610 or over the buried insulator layer 612. Some portions of the diode 604 understood by one of skill in the art to be present have been omitted from FIG. 6 for simplicity. For example, metallization layers and other interconnects understood to be present are omitted from FIG. 6. The active region 614 generally includes regions of the first conductivity type and regions of the second conductivity type in accordance with respective regions in the active region 314 of the LDMOS 302. In some embodiments, regions of the first conductivity type of the diode 604 have the same doping depth and concentration as corresponding regions of the LDMOS 302, but the lateral extents differ. Similarly, in some embodiments, regions of the second conductivity type of the diode 604 have the same doping depth and concentration as corresponding regions of the LDMOS 302, but the lateral extents differ. The regions of the first conductivity type include a cathode contact region 618, an LDD region 620, and a buried region 626. The regions of the second conductivity type include a body region 622, an anode contact region 623, and the buried well 624. A source region, similar to the source region 316, is omitted from the diode 604. Omitting a source region is omitted creates an anode region within the diode 604. The anode region includes the anode contact region 623, the body region 622 and the buried well 624, each region being of the second conductivity type. Top metal forms an anode contact electrode 632 which is electrically coupled to an anode terminal (A) located in a third dimension. Top metal also forms a cathode contact electrode 634 which is electrically coupled to a cathode terminal (C) located in a third dimension. The anode contact region 623 is electrically coupled to source contact region 323 of the LDMOS 302, and the cathode contact region 618 is electrically coupled to the drain region 318 of the LDMOS 302 (e.g., by top metal). A lateral gate electrode 628 with a silicide layer 630 is electrically coupled to the anode contact region 623 either directly (e.g., by top metal), or through an optional resistor 644 which is the same or similar to the resistor 444. The gate electrode 628 is electrically isolated from the gate electrode 328 of the LDMOS 302. A dielectric 638 electrically insulates portions of the active region 614. A shielding structure 636 extends laterally over the gate electrode 628. A target breakdown voltage of the diode 604 is further modified from the target breakdown voltage of the diode 504 by the reduction of the lateral distance 652 as compared to the lateral distance 552 of the diode 504. The lateral distance 652 can be designed such that a target breakdown voltage of the diode 604 is lower than a breakdown voltage of the LDMOS 302.

Figure 7:
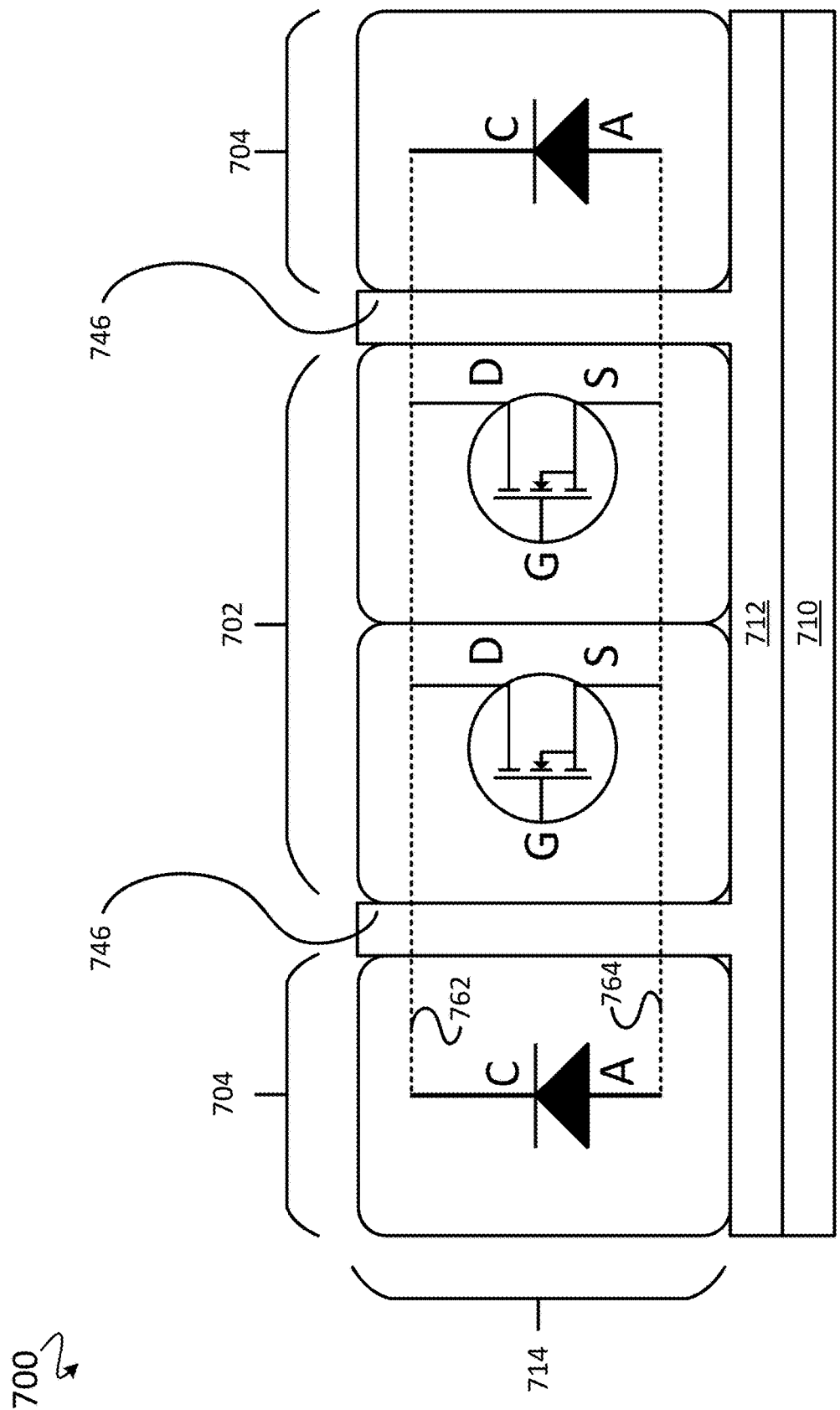
FIGS. 7-9 are simplified cross-section diagrams of multi-finger semiconductor devices, in accordance with some embodiments.

FIG. 7 shows a simplified orthoscopic diagram of a multi-finger semiconductor device 700, in accordance with some embodiments. The semiconductor device 700 generally includes a substrate 710, a buried insulator layer 712, and an active region 714. The active region 714 generally includes one or more active fingers 702 and one or more dummy fingers 704. As shown, protective diodes are formed in the dummy fingers 704, and LDMOS devices are formed in the active fingers 702. In the embodiment shown, insulating barrier regions 746 electrically isolate the active fingers 702 from the dummy fingers 704. In some embodiments, the insulator barrier regions 746 are shallow trench isolation (STI) regions. In other embodiments, the insulator barrier regions are deep trench isolation regions (DTI). Electrical connections in a third dimension shown schematically as a dashed line 762 electrically couple cathode regions (C) of the diodes to drain regions (D) of the LDMOS devices, and electrical connections in a third dimension shown schematically as a dashed line 764 electrically couple anode regions (A) of the diodes to source regions (S) of the LDMOS devices.

Figure 8:
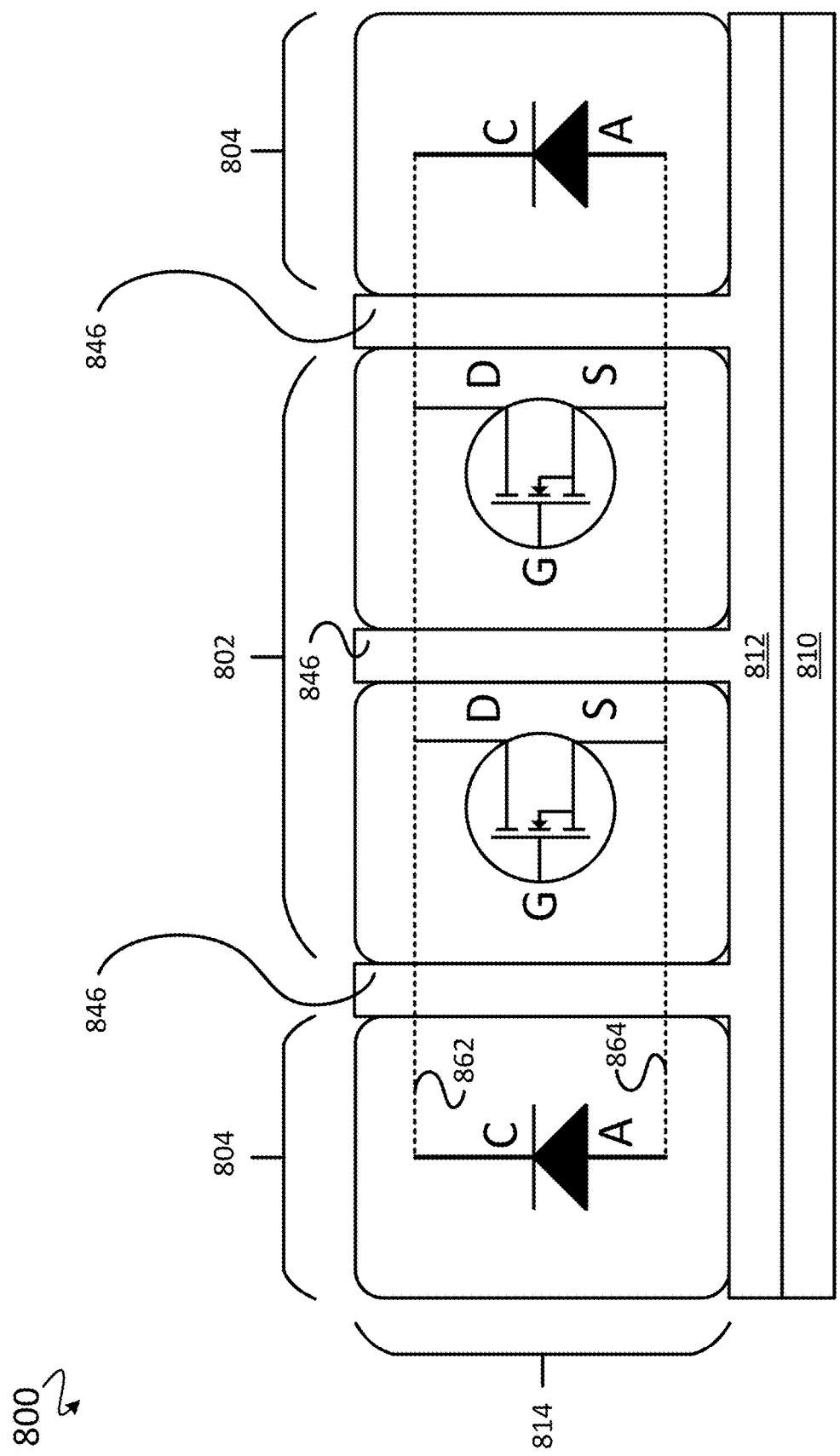

FIG. 8 shows a simplified orthoscopic diagram of a multi-finger semiconductor device 800, in accordance with some embodiments. The semiconductor device 800 generally includes a substrate 810, a buried insulator layer 812, and an active region 814. The active region 814 generally includes one or more active fingers 802 and one or more dummy fingers 804. As shown, protective diodes are formed in the dummy fingers 804, and LDMOS devices are formed in the active fingers 802. In the embodiment shown, insulating barrier regions 846 electrically isolate adjacent LDMOS devices formed in the active fingers 802, as well as electrically isolate the active fingers 802 from the dummy fingers 804. Electrical connections in a third dimension shown schematically as a dashed line 862 couple cathode regions (C) of the diodes to drain regions (D) of the LDMOS devices, and electrical connections in a third dimension shown schematically as a dashed line 864 electrically couple anode regions (A) of the diodes to source regions (S) of the LDMOS devices.

Figure 9:
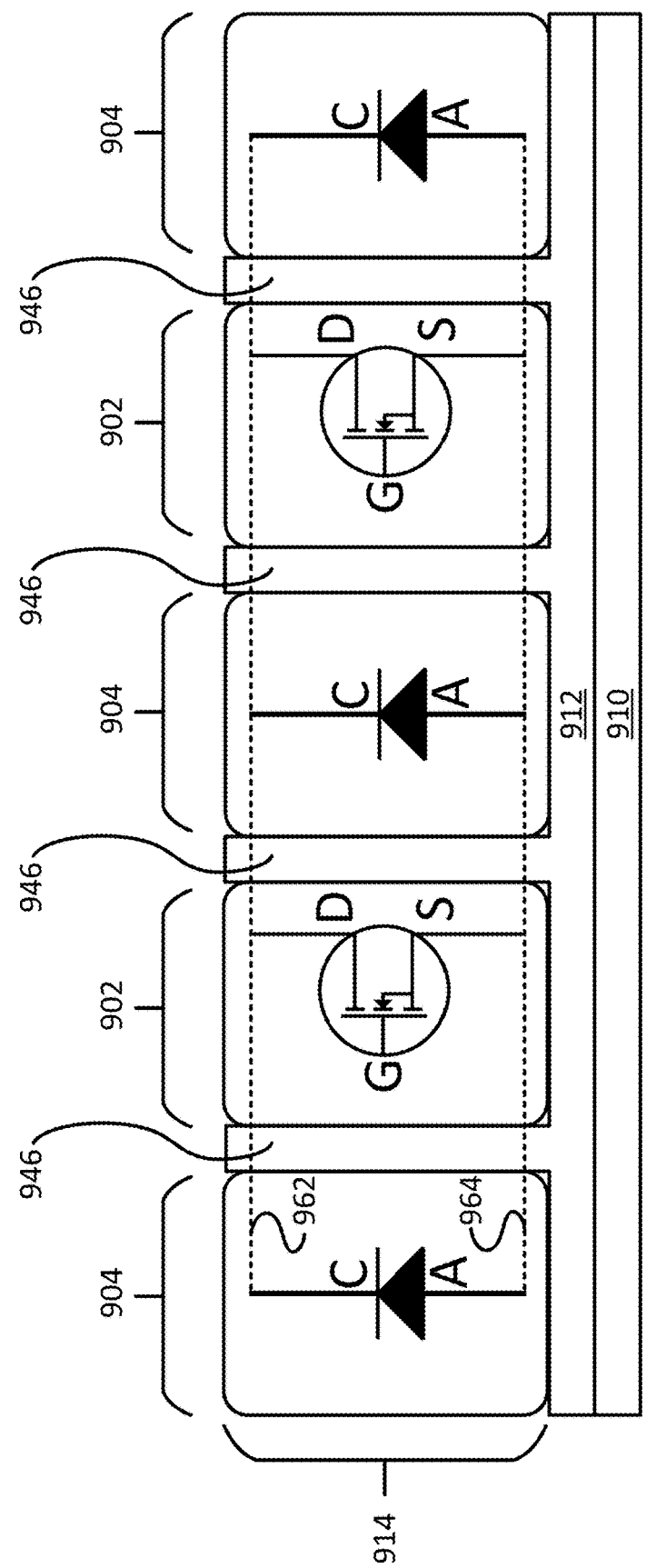

FIG. 9 shows a simplified orthoscopic diagram of a multi-finger semiconductor device 900, in accordance with some embodiments. The semiconductor device 900 generally includes a substrate 910, a buried insulator layer 912, and an active region 914. The active region 914 generally includes one or more active fingers 902 interleaved with one or more dummy fingers 904. As shown, protective diodes are formed in the dummy fingers 904, and LDMOS devices are formed in the active fingers 902. In the embodiment shown, insulating barrier regions 946 electrically isolate LDMOS devices formed in the active fingers 802 from adjacent diodes formed in the dummy fingers 904. Electrical connections in a third dimension shown schematically as a dashed line 962 couple cathode regions (C) of the diodes to drain regions (D) of the LDMOS devices, and electrical connections in a third dimension shown schematically as a dashed line 964 electrically couple anode regions (A) of the diodes to source regions (S) of the LDMOS devices.

Figure 10A:
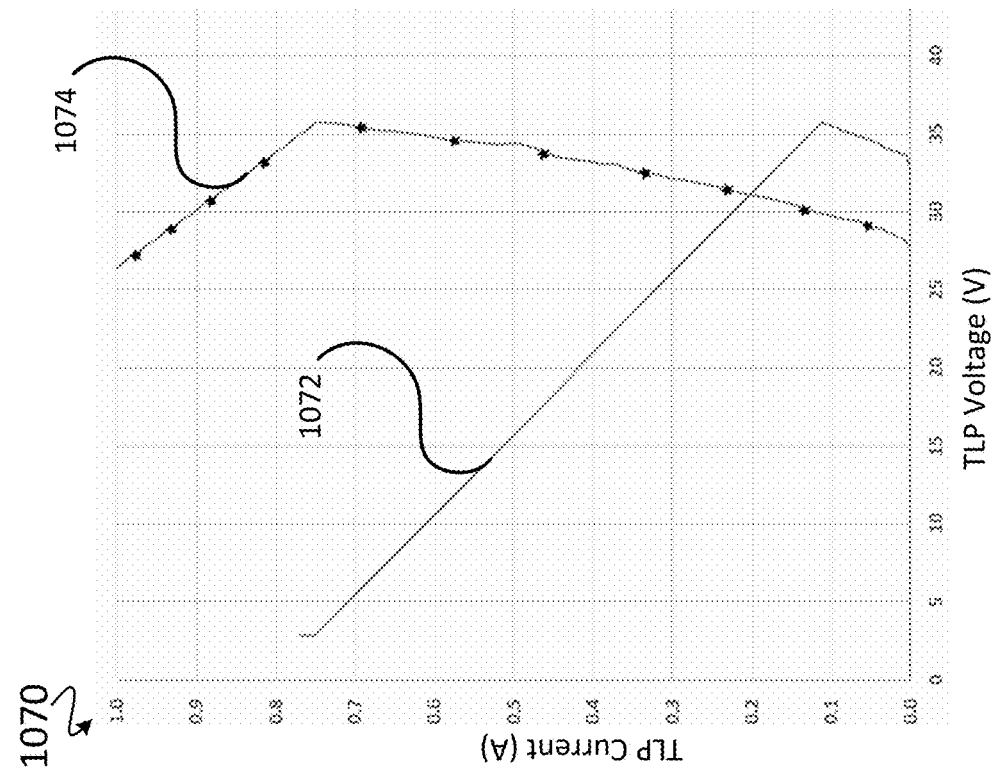
FIGS. 10A-B are graphs of example experimental results measured using example embodiments disclosed herein.
Figure 10B:
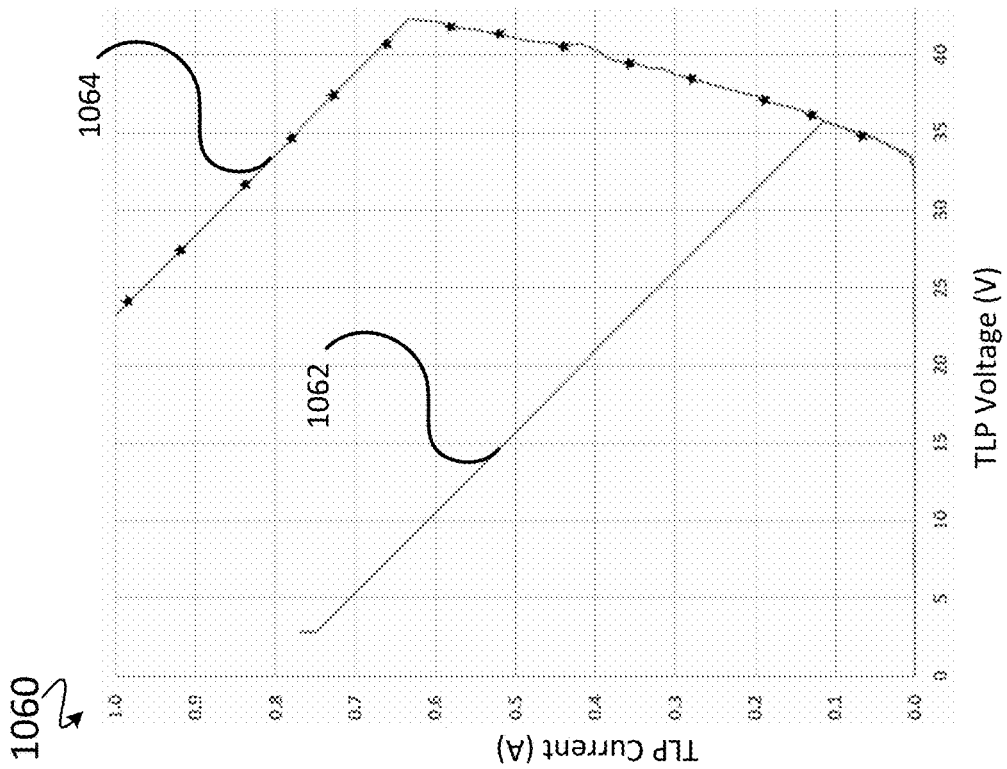

FIGS. 10A-B are simplified graphs 1060, 1070 of example experimental results measured using example embodiments disclosed herein. Lines 1062 and 1072 are measured transmission line pulse (TLP) curves generated using an LDMOS similar to the LDMOS 302. Line 1064 is a TLP curve generated using a diode that is similar to the diode 504 with a direct electrical coupling of the gate electrode 428 to the anode contact region 423 and having a shielding structure similar to the shielding structure 336. Line 1074 is a TLP curve generated using a diode similar to the diode 404 or 604. A comparison of the line 1064 to the line 1062 shows a measured indication of ESD robustness of the diode 504 as being two times greater than a measured indication of ESD robustness of the LDMOS 302. A comparison of line 1074 to line 1072 shows a measured indication of ESD robustness of the diode 404 or 604 (or other similar embodiments which match a breakdown voltage of the LDMOS 302) as being seven times greater than a measured indication of ESD robustness of the LDMOS 302.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. A semiconductor device, comprising:
    a substrate;
    an active region comprising a FET and a diode formed over the substrate;
    one or more FET fingers of the FET formed in the active region and having a FET source region, a FET drain region, and a lateral FET gate electrode; and
    one or more diode fingers of the diode formed in the active region and having a diode anode region electrically coupled to the FET source region, a diode cathode region electrically coupled to the FET drain region, and a lateral diode gate electrode electrically coupled to the diode anode region and electrically isolated from the lateral FET gate electrode;
    wherein:
    the one or more FET fingers of the FET are active fingers of the semiconductor device and the one or more diode fingers of the diode are dummy fingers of the semiconductor device;
    the diode is configured to clamp a maximum voltage developed across the FET drain region and the FET source region;
    a lateral distance between the lateral FET gate electrode and the FET drain region is greater than a lateral distance between the lateral diode gate electrode and the diode cathode region; and
    a target breakdown voltage of the diode is configured based on the lateral distance between the lateral diode gate electrode and the diode cathode region.

2. The semiconductor device of claim 1, further comprising:
    a resistor that electrically couples the lateral diode gate electrode to the diode anode region.

3. The semiconductor device of claim 1, further comprising:
    a FET shielding structure electrically coupled to the FET source region and laterally overlapping at least a portion of the lateral FET gate electrode; and
    a diode shielding structure electrically coupled to the diode anode region and laterally overlapping at least a portion of the lateral diode gate electrode.

4. The semiconductor device of claim 1, further comprising:
    a FET shielding structure electrically coupled to the FET source region and laterally overlapping at least a portion of the lateral FET gate electrode; and
    a truncated diode shielding structure electrically coupled to the diode anode region and not laterally overlapping any portion of the lateral diode gate electrode.

5. The semiconductor device of claim 1, further comprising:
    a buried electrical insulator layer between the substrate and the active region, the buried electrical insulator layer extending laterally below the one or more FET fingers and the one or more diode fingers.

6. The semiconductor device of claim 5, further comprising:
    an electrical insulator barrier layer between the one or more FET fingers and the one or more diode fingers, the electrical insulator barrier layer extending from a top surface of the buried electrical insulator layer into the active region.

7. The semiconductor device of claim 1, wherein:
    the semiconductor device has greater than or equal to ten active fingers for every one diode finger that comprises a diode.

8. The semiconductor device of claim 1, wherein:
    the FET further comprises a FET body region, and a FET buried well region;
    the diode further comprises a diode body region, and a diode buried well region;
    the FET source region, the FET drain region, and the diode cathode region are of a first conductivity type; and
    the FET body region, the FET buried well region, the diode body region, the diode buried well region, and the diode anode region are of a second conductivity type.

9. The semiconductor device of claim 8, wherein:
    a breakdown voltage of the diode is configured by a distance between the diode cathode region and the diode body region.

10. The semiconductor device of claim 8, wherein:
    a lateral distance between the FET drain region and the FET buried well region is greater than a lateral distance between the diode cathode region and the diode buried well region.

11. The semiconductor device of claim 8, wherein:
    a doping depth, concentration and lateral extent of the FET drain region is substantially the same as a doping depth, concentration and lateral extent of the diode cathode region;

a doping depth, concentration and lateral extent of the FET body region is substantially the same as a doping depth, concentration and lateral extent of the diode body region;

a doping concentration of the FET buried well region is substantially the same as a doping concentration of the diode buried well region; and a doping depth, concentration and lateral extent of the FET source region is different than a doping depth, concentration, and lateral extent of the diode anode region.

12. A semiconductor device, comprising:

a substrate;

an active region formed over the substrate, the active region comprising one or more active fingers and one or more diode fingers, wherein:

each active finger comprises an active lateral gate electrode, a plurality of first active doped regions of a first conductivity type, and one or more second active doped regions doped of a second conductivity type;

each diode finger comprises a diode lateral gate electrode, one or more first diode doped regions of the first conductivity type, and one or more second diode doped regions of the second conductivity type;

each active finger includes more regions doped to the first conductivity type than does the diode finger;

the active finger includes the same number of regions doped to the second conductivity type as does the diode finger;

the active lateral gate electrode is electrically isolated from the diode lateral gate electrode;

the diode lateral gate electrode is electrically coupled to a diode region of the second diode doped regions;

the one or more diode fingers are dummy fingers of the semiconductor device; and the one or more diode fingers are configured to clamp a maximum voltage developed across two of the first active doped regions.

13. The semiconductor device of claim 12, further comprising:

a resistor that electrically couples the diode lateral gate electrode to a diode doped region of the second diode doped regions.

14. The semiconductor device of claim 12, wherein:

a first active doped region of the first active doped regions is electrically coupled to a first diode doped region of the first diode doped regions; and a second active doped region of the first active doped regions is electrically coupled to a second diode doped region of the second diode doped regions.

15. The semiconductor device of claim 12, further comprising:

an active finger shielding structure electrically coupled to an active doped region of the first active doped regions and laterally overlapping at least a portion of the active lateral gate electrode; and a truncated diode shielding structure electrically coupled to a diode doped region of the second diode doped regions and not laterally overlapping any portion of the diode lateral gate electrode.

16. A method for forming a semiconductor device, the method comprising:

providing a substrate;

forming an active region over the substrate, the active region comprising one or more active fingers and one or more diode fingers;

forming within one or more of the active fingers, a FET having a FET source region, a FET drain region, and a lateral FET gate electrode;

forming within one or more of the diode fingers, a diode having a diode anode region, a diode cathode region, and a lateral diode gate electrode;

electrically coupling the FET source region to the diode anode region;

electrically coupling the FET drain region to the diode cathode region; and electrically coupling the lateral diode gate electrode to the diode anode region;

wherein:

the one or more diode fingers are dummy fingers of the semiconductor device;

the lateral FET gate electrode is electrically isolated from the lateral diode gate electrode;

the diode is configured to clamp a maximum voltage developed across the FET drain region and the FET source region the FET further comprises a FET body region, and a FET buried well region;

the diode anode region further comprises a diode body region, and a diode buried well region;

the FET source region, the FET drain region, and the diode cathode region are of a first conductivity type; and the FET body region, the FET buried well region, the diode body region, and the diode buried well region, are of a second conductivity type.

17. The method of claim 16, further comprising:

electrically coupling the lateral diode gate electrode to the diode anode region using a resistor.

18. The method of claim 16, wherein:

a doping depth, concentration and lateral extent of the FET drain region is substantially the same as a doping depth, concentration and lateral extent of the diode cathode region;

a doping depth, concentration and lateral extent of the FET body region is substantially the same as a doping depth, concentration and lateral extent of the diode body region;

a doping concentration of the FET buried well region is substantially the same as the doping concentration of the diode buried well region; and a doping depth, concentration and lateral extent of the FET source region is different than a doping depth, concentration, and lateral extent of the diode anode region.

19. The method of claim 18, wherein:

a breakdown voltage of the diode is configured by a distance between the diode cathode region and the diode body region.

20. The method of claim 18, wherein:

a lateral distance between the FET drain region and the lateral FET gate electrode is greater than a lateral distance between the diode cathode region and the lateral diode gate electrode.

21. The method of claim 18, wherein:

a lateral distance between the FET drain region and the FET buried well region is greater than a lateral distance between the diode cathode region and the diode buried well region.

* * * * *